United States Patent
Yao et al.

(10) Patent No.: US 11,502,183 B2
(45) Date of Patent: Nov. 15, 2022

(54) AIR GAP IN INNER SPACERS AND METHODS OF FABRICATING THE SAME IN FIELD-EFFECT TRANSISTORS

(71) Applicant: Taiwan Semiconductor Manufacturing Co., Ltd., Hsin-Chu (TW)

(72) Inventors: Chien Ning Yao, Hsinchu (TW); Bo-Feng Young, Taipei (TW); Sai-Hooi Yeong, Hsinchu County (TW); Kuan-Lun Cheng, Hsin-Chu (TW); Chih-Hao Wang, Hsinchu County (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 58 days.

(21) Appl. No.: 17/107,374

(22) Filed: Nov. 30, 2020

(65) Prior Publication Data

US 2021/0234017 A1 Jul. 29, 2021

Related U.S. Application Data

(60) Provisional application No. 62/967,285, filed on Jan. 29, 2020.

(51) Int. Cl.
*H01L 29/49* (2006.01)
*H01L 29/06* (2006.01)
(Continued)

(52) U.S. Cl.
CPC .... *H01L 29/4991* (2013.01); *H01L 21/02603* (2013.01); *H01L 21/28123* (2013.01); *H01L 21/764* (2013.01); *H01L 29/0673* (2013.01); *H01L 29/42392* (2013.01); *H01L 29/66545* (2013.01); *H01L 29/66553* (2013.01); *H01L 29/66636* (2013.01); *H01L 29/66742* (2013.01);
(Continued)

(58) Field of Classification Search
CPC .......... H01L 29/4991; H01L 21/02603; H01L 21/28123; H01L 21/764; H01L 29/0673; H01L 29/42392; H01L 29/66545; H01L 29/66553; H01L 29/66636; H01L 29/66742; H01L 29/78618; H01L 29/78696; H01L 29/0653; H01L 29/66439; H01L 29/6656; H01L 29/775; H01L 29/165; H01L 29/7848; H01L 21/823431; H01L 21/823481; H01L 21/823821; H01L 21/823878; H01L 27/0886; H01L 27/0924; H01L 29/66772; B82Y 10/00
USPC ........................................ 257/347
See application file for complete search history.

(56) References Cited

U.S. PATENT DOCUMENTS

2017/0110554 A1* 4/2017 Tak ................. H01L 29/66439
2017/0294537 A1 10/2017 Cheng et al.
(Continued)

*Primary Examiner* — Tong-Ho Kim
(74) *Attorney, Agent, or Firm* — Haynes and Boone, LLP

(57) ABSTRACT

A semiconductor structure includes a stack of semiconductor layers disposed over a substrate, a metal gate stack having a top portion disposed over the stack of semiconductor layers and a bottom portion interleaved with the stack of semiconductor layers, an inner spacer disposed on sidewalls of the bottom portion of the metal gate stack, an air gap enclosed in the inner spacer, and an epitaxial source/drain (S/D) feature disposed over the inner spacer and adjacent to the metal gate stack.

20 Claims, 11 Drawing Sheets

(51) Int. Cl.
  *H01L 29/423* (2006.01)
  *H01L 29/786* (2006.01)
  *H01L 21/02* (2006.01)
  *H01L 21/28* (2006.01)
  *H01L 21/764* (2006.01)
  *H01L 29/66* (2006.01)

(52) U.S. Cl.
  CPC .. *H01L 29/78618* (2013.01); *H01L 29/78696* (2013.01)

(56) References Cited

U.S. PATENT DOCUMENTS

| | | |
|---|---|---|
| 2018/0331232 A1 | 11/2018 | Frougier et al. |
| 2018/0358435 A1 | 12/2018 | Mochizuki et al. |
| 2019/0123163 A1 | 4/2019 | Yang et al. |
| 2019/0157444 A1* | 5/2019 | Yang ................ H01L 29/66439 |

* cited by examiner

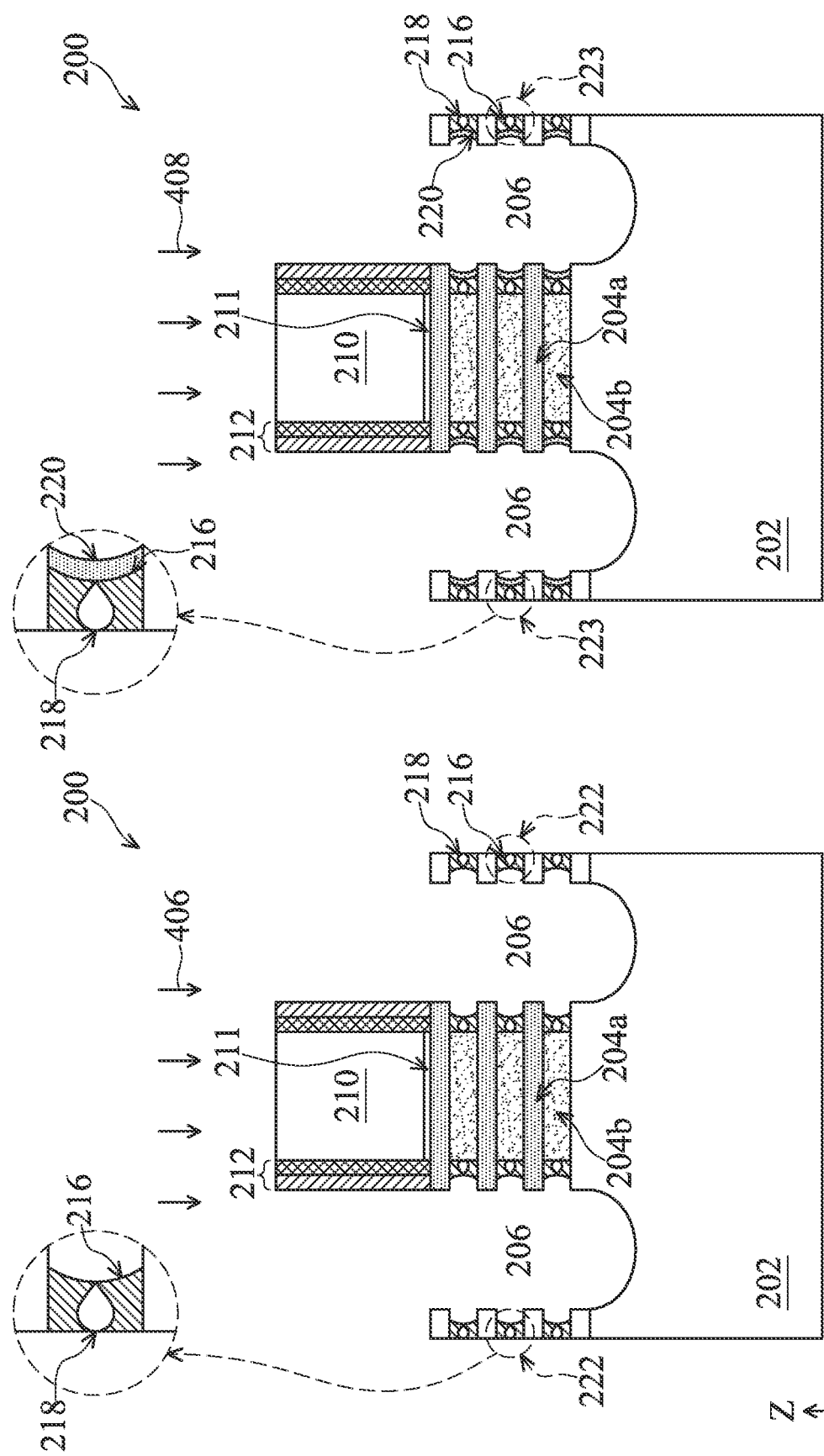

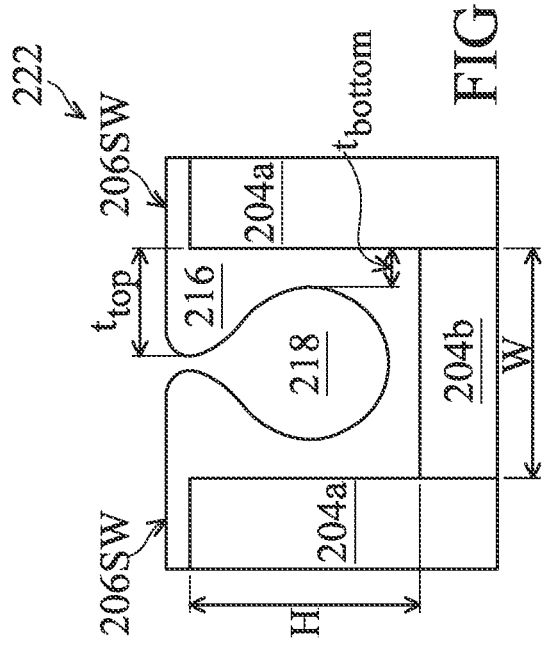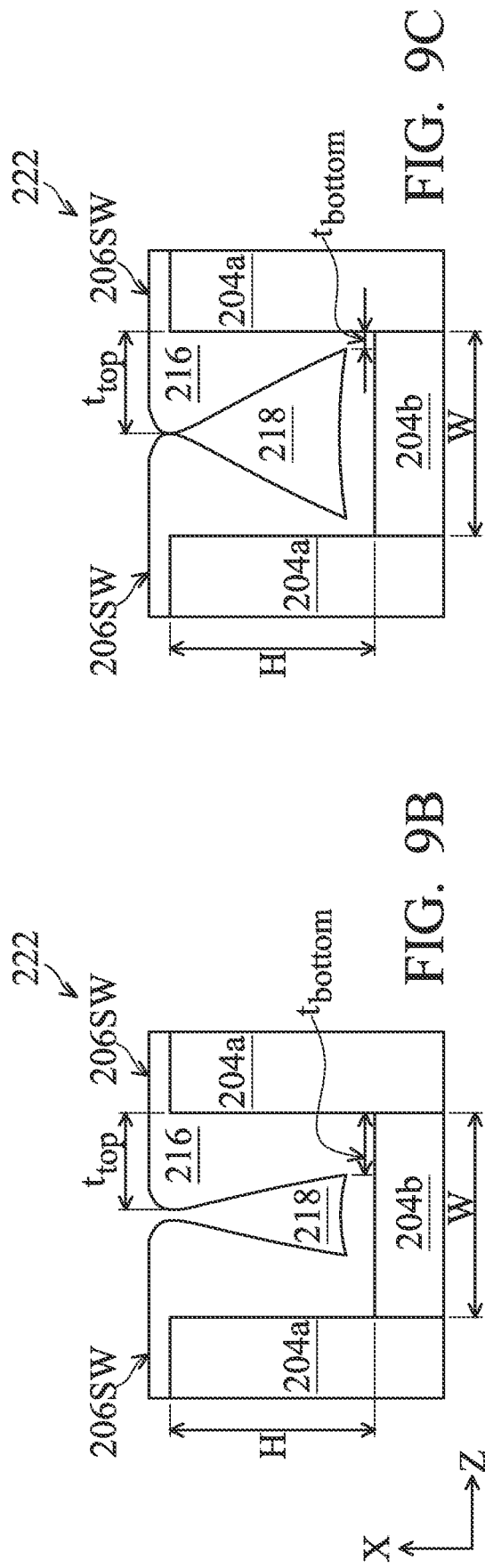

AIR GAP IN INNER SPACERS AND METHODS OF FABRICATING THE SAME IN FIELD-EFFECT TRANSISTORS

CROSS-REFERENCE TO RELATED APPLICATIONS

This is a non-provisional application of and claims priority to U.S. Provisional patent Application Ser. No. 62/967,285, filed on Jan. 29, 2020, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) transistors, have been incorporated into various memory and core devices to reduce IC chip footprint while maintaining reasonable processing margins. As with other semiconductor devices, scaling down has indeed increased the complexity of manufacturing GAA transistors. In one such example, providing inner spacers capable of reducing parasitic capacitance becomes more challenging when device sizes continue to decrease. For at least this reason, improvements in methods of fabricating inner spacers in GAA transistors are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9A, 9B, 9C, 10A, 10B, 11A, 11B, 12A, 12B, 13A, and 13B are cross-sectional views of the semiconductor device taken along line AA' as shown in FIGS. 2A and/or 2B, in portion or in entirety, during intermediate stages of the method shown in FIGS. 1A and/or 1B according to various embodiments of the present disclosure.

DETAILED DESCRIPTION

Figure 1A:
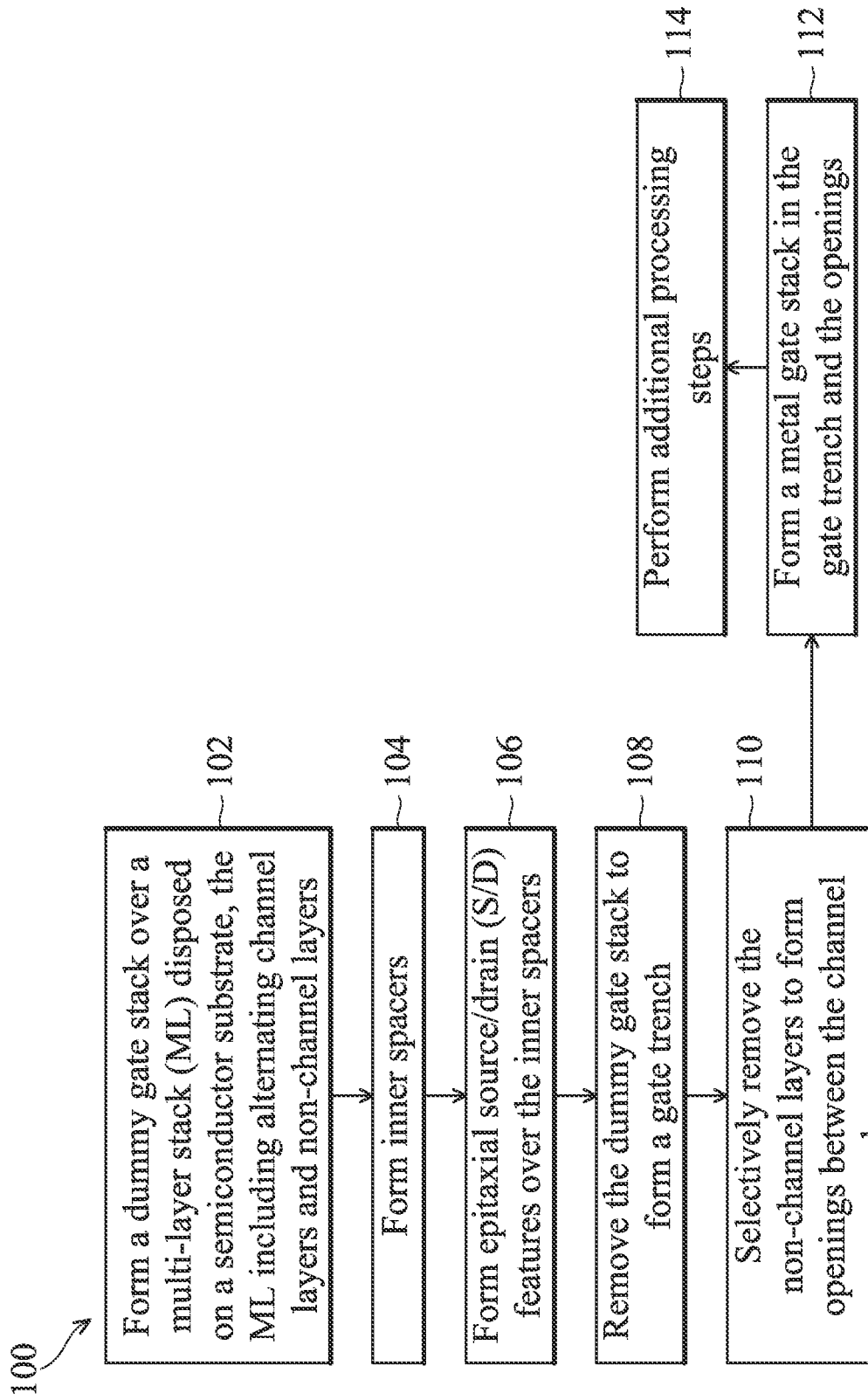
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional gate-all-around (GAA) FETs, fin FETs (FinFETs), and/or other FETs. Generally, a GAA FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. The present disclosure includes multiple embodiments. Different embodiments may have different advantages, and no particular advantage is necessarily required of any embodiment.

Figure 1B:
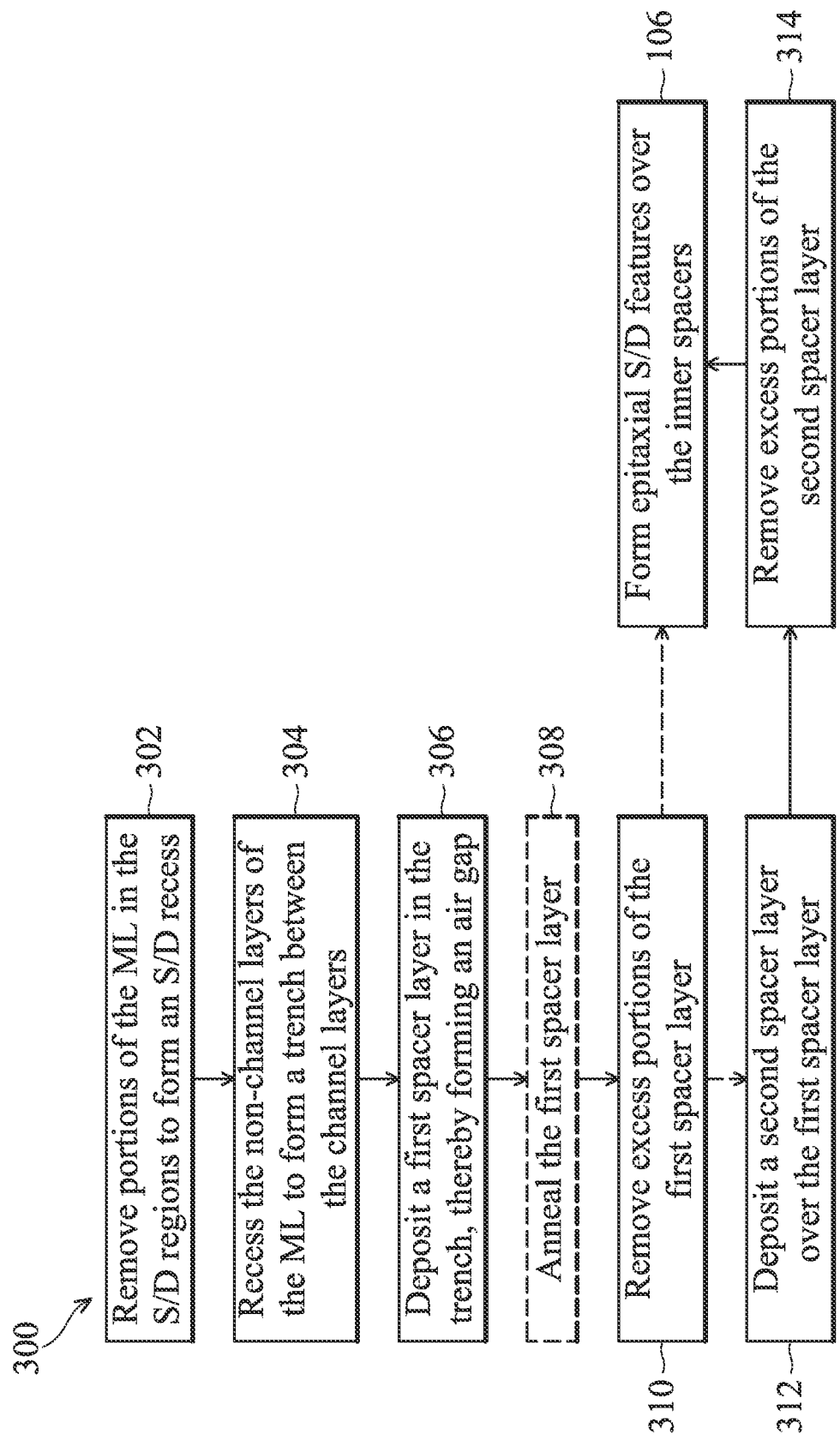

Referring now to FIGS. 1A and 1B, flowcharts of a method 100 and a method 300 of forming a semiconductor device 200 (hereafter simply referred to as the device 200) are illustrated according to various aspects of the present disclosure. Methods 100 and 300 are merely examples and are not intended to limit the present disclosure beyond what is explicitly recited in the claims. Additional operations can be provided before, during, and after methods 100 and 300, and some operations described can be replaced, eliminated, or moved around for additional embodiments of the method. Methods 100 and 300 are described below in conjunction with FIGS. 3-13B, which are cross-sectional views of the device 200 taken along the dashed line AA' shown in FIGS. 2A and 2B at intermediate steps of method 100. The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

At operation 102, referring to FIGS. 1A and 2A-4, method 100 forms the device 200 that includes one or more fins (or active regions) 204 protruding from a substrate 202 and separated by isolation structures 208, a dummy gate stack 210 disposed over the fins 204, and top spacers 212 disposed on sidewalls of the dummy gate stack 210. Though not depicted, the device 200 may include other components, such as hard mask layers, barrier layers, other suitable layers, or combinations thereof, disposed over the dummy gate stack 210.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Each fin 204 may be suitable for providing an n-type FET or a p-type FET. In some embodiments, the fins 204 as illustrated herein may be suitable for providing FETs of a similar type, i.e., both n-type or both p-type. Alternatively, they may be suitable for providing FETs of different types, i.e., an n-type and a p-type. This configuration is for illustrative purposes only and is not intended to be limiting.

Figure 2B:
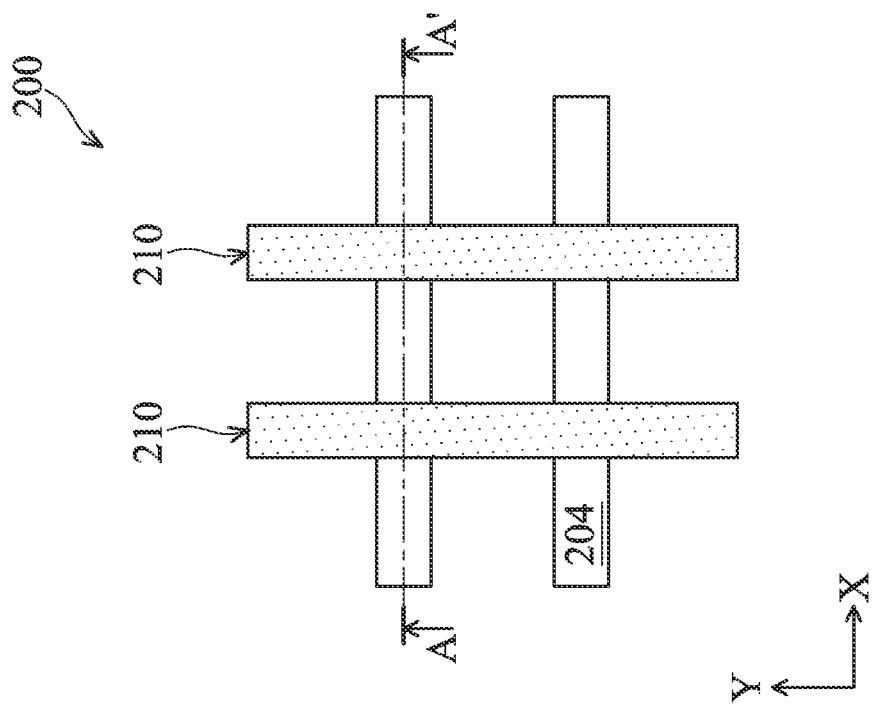
FIG. 2B is a planar top view of the semiconductor device shown in FIG. 2A according to various embodiments of the present disclosure.
Figure 2A:
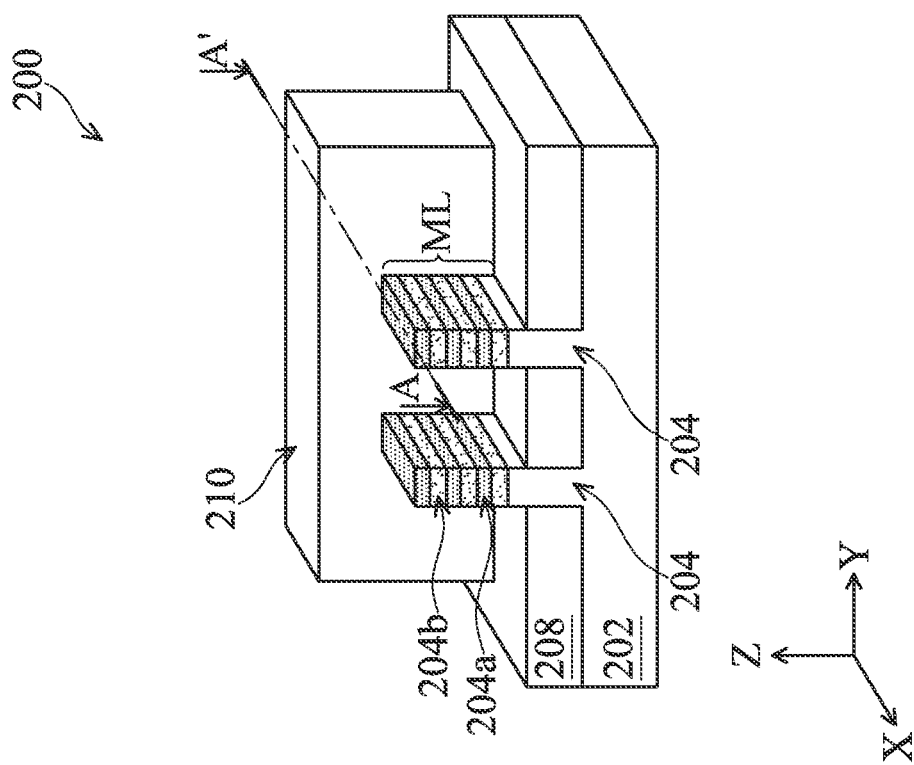
FIG. 2A is a three-dimensional perspective view of an example semiconductor device according to various embodiments of the present disclosure.
Figure 3:
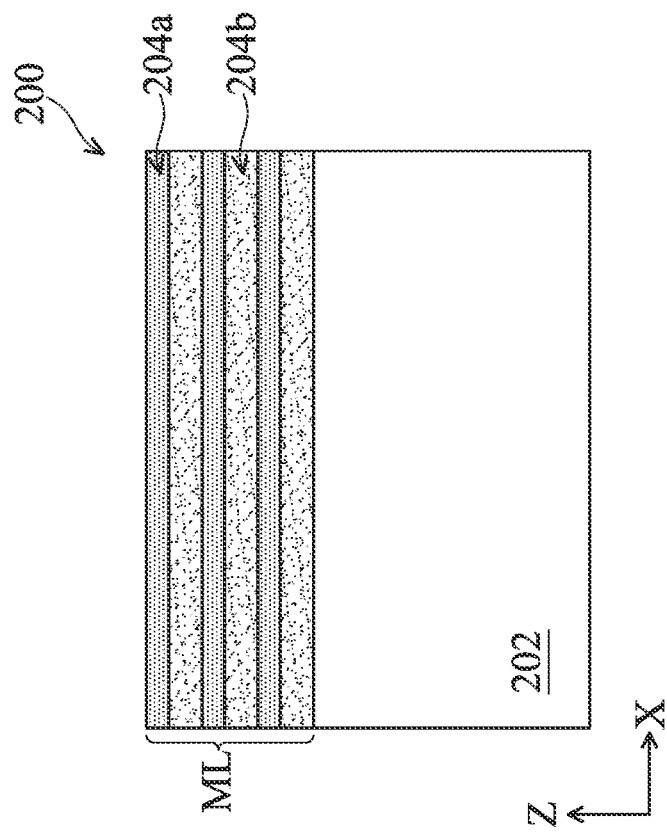

In the present embodiments, referring to FIGS. 2A and 3, each fin 204 includes a multi-layer stack (ML) of alternating semiconductor layers 204*b* and semiconductor layers 204*a* stacked vertically over protruding portions of the substrate 202. In the present embodiments, each semiconductor layer 204*b* is a sacrificial layer configured to be removed at a subsequent processing step, thereby providing openings between the semiconductor layers 204*a* (and the substrate 202) for forming metal gate stacks therein. Each semiconductor layer 204*a* may include a semiconductor material such as, for example, Si, Ge, SiC, SiGe, GeSn, SiGeSn, SiGeCSn, other suitable semiconductor materials, or combinations thereof, while each semiconductor layer 204*b* has a composition different from that of the semiconductor layer 204*a*. In one such example, the semiconductor layers 204*a* may include elemental Si but is free, or substantially fee of Ge, and the semiconductor layers 204*b* may include SiGe. In another example, the semiconductor layers 204*a* may include elemental Si but is free, or substantially fee of Ge, and the semiconductor layers 204*b* may include elemental Ge. In some examples, each fin 204 may include a total of three to ten pairs of alternating semiconductor layers 204*a* and 204*b*; of course, other configurations may also be applicable depending upon specific design requirements.

In the present embodiments, forming the ML includes alternatingly growing the semiconductor layers 204*a* and 204*b* in a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the semiconductor layers 204*b*), which interact with the composition of the underlying substrate, e.g., the substrate 202. In some examples, the semiconductor layers 204*a* and 204*b* may be formed into nanosheets, nanowires, or nanorods. A sheet (or wire) formation process may then be implemented to remove the semiconductor layers 204*b* to form openings between the semiconductor layers 204*a*, and a metal gate stack is subsequently formed in the openings, thereby providing an GAA FET. In other words, the remaining semiconductor layers 204*a* engage with the metal gate stack (e.g., a high-k metal gate stack, or HKMG, where "high-k" refers to a dielectric material having a dielectric constant greater than that of silicon oxide, which is about 3.9) to provide channel regions of the GAA FET. Accordingly, the semiconductor layers 204*a* are hereafter referred to as channel layers 204*a* and the semiconductor layers 204*b* are hereafter referred to as non-channel layers 204*b*.

In the present embodiments, the fins 204 are fabricated from the ML and the substrate 202 in a series of photolithography and etching processes. For example, the photolithography process may include forming a photoresist layer overlying the ML, exposing the photoresist layer to a pattern, performing post-exposure bake processes, and developing the exposed photoresist layer to form a patterned masking element (not depicted). The ML is then etched using the patterned masking element as an etch mask, thereby leaving three-dimensional fins 204 protruding from the substrate 202. The etching process may include dry etching, wet etching, reactive ion etching (RIE), other suitable processes, or combinations thereof. The patterned masking element is subsequently removed from the ML using any suitable process, such as ashing and/or resist stripping.

Additionally or alternatively, other embodiments of methods for forming the fins 204 may also be suitable. For example, the ML (and the substrate 202) may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the ML to form the fins 204.

Multi-gate devices, such as GAA FETs, have been introduced to improve gate control by increasing gate-channel coupling, reduce OFF-state current, and reduce short-channel effects (SCEs). A GAA FET generally includes a gate structure that wraps around a plurality of horizontal semiconductor layers, thereby providing access to the channel region on all sides. The GAA FETs are generally compatible with CMOS processes, allowing them to be scaled down while maintaining gate control and mitigating SCEs. Of course, the present disclosure is not limited to forming GAA FETs only and may provide other three-dimensional FETs such as FinFETs. As such, one or more of the fins 204 may include a single layer of semiconductor material such that a uniform fin is provided to form a FinFET.

Because HKMGs are interleaved between channel layers in a GAA FET, inner gate spacers are provided between sidewalls of the HKMGs and portions of epitaxial source/drain (S/D) features disposed adjacent to the HKMGs to reduce parasitic capacitance of the device, which generally decreases with increasing thickness of the inner spacers. However, while the inner spacers generally offer the advantage of reducing capacitance in GAA FETs, they have not been entirely satisfactory in all aspect. For example, increase in thickness of the inner spacers for purposes of reducing parasitic capacitance between the HKMGs and adjacent S/D features may reduce the effective channel length of the device and thus inducing adverse short-channel effects (SCEs) in the device. The present disclosure provides methods of forming inner spacers to reduce parasitic capacitance in GAA FETs without substantially shortening the effective channel length of the devices caused by thicker inner spacers. In some embodiments, the present disclosure provides inner spacers having an air gap embedded in one or more dielectric material.

Referring back to FIG. 2A, the isolation structures 208 may include silicon oxide (SiO and/or SiO$_2$), a low-k dielectric material, tetraethylorthosilicate (TEOS), doped silicon oxide (e.g., borophosphosilicate glass (BPSG), fluoride-doped silicate glass (FSG), other suitable materials, or combinations thereof. The isolation structures 208 may include shallow trench isolation (STI) features. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. In another embodiment, the isolation structures 208 are formed by depositing a dielectric layer as a spacer layer over the fins 204 and subsequently recessing the dielectric layer such that a top surface of the isolation structures 208 is below a top surface of the fins 204. The isolation structures 208 may be deposited by any suitable method, such as CVD, flowable CVD (FCVD), spin-on-glass (SOG), other suitable methods, or combinations thereof.

Figure 4:
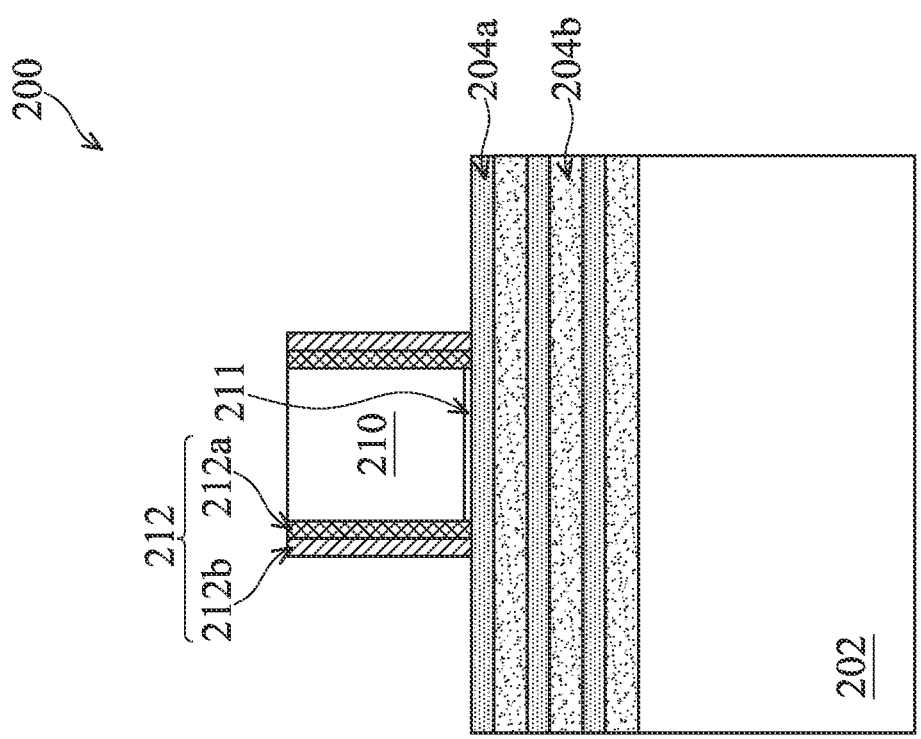

Still referring to FIGS. 2A, 2B, and 4, the dummy gate stack (or a placeholder gate stack) 210 is disposed over the fins 204 (and thus the ML) and may include polysilicon. In the present embodiments, portions of the dummy gate stack 210 are replaced with a HKMG after forming other components of the device 200. The dummy gate stack 210 may be formed by a series of deposition and patterning processes. For example, the dummy gate stack 210 may be formed by depositing a polysilicon layer over the fins 204 and performing an anisotropic etching process (e.g., a dry etching process) to remove portions of the polysilicon. In some embodiments, as depicted in FIG. 4, removing portions of the polysilicon layer may also remove a top portion of the ML, resulting in a curved upper surface as indicated by the dotted line. In the present embodiments, the device 200 further includes an interfacial layer 211, which is formed on the fin 204 before depositing the polysilicon layer by a suitable method, such as thermal oxidation, chemical oxidation, other suitable methods, or combinations thereof.

Thereafter, still referring to FIG. 4, the top spacers 212 may be formed on the sidewalls of the dummy gate stack 210. The top spacers 212 may be a single-layer structure or a multi-layer structure and may include silicon nitride (SiN), silicon oxide (SiO and/or SiO$_2$), silicon carbide (SiC), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, other suitable materials, or combinations thereof. In the present embodiments, the top spacers 212 includes a spacer layer 212a formed on the sidewalls of the dummy gate stack 210 and a spacer layer 212b formed on the spacer layer 212a. Each spacer layer of the top spacers 212 may be formed by first depositing a dielectric layer over the dummy gate stack 210 and subsequently removing portions of the dielectric layer in an anisotropic etching process (e.g., a dry etching process), leaving portions of the dielectric layer on the sidewalls of the dummy gate stack 210 as the top spacers 212.

Subsequently, method 100 at operation 104 forms inner spacers (e.g., inner spacers 222 or 223) for the device 200, which are provided between the subsequently-formed epitaxial S/D features (e.g., epitaxial S/D features 230) and sidewalls of the non-channel layers 204b. In the present embodiments, operation 104 implements an embodiment of method 300 depicted in FIG. 1B to form the inner spacers 222 or 223. In the following disclosure, method 300 is discussed in detail with reference to FIGS. 5 to 13B.

Figure 5:
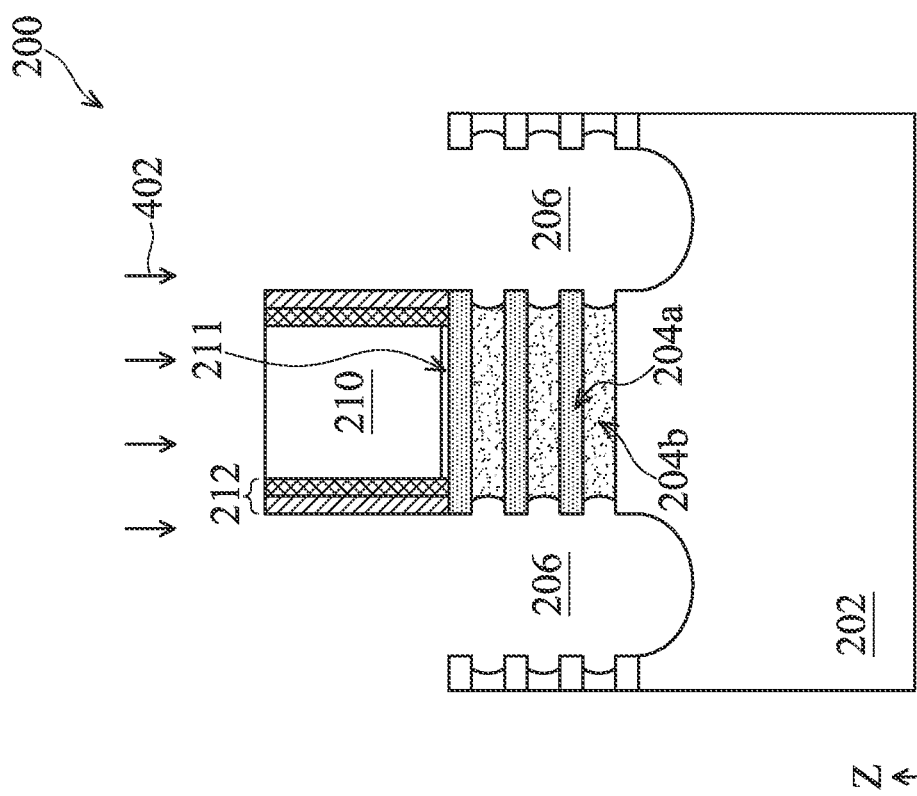

Referring to FIG. 5, method 300 at operation 302 remove portions of the ML to form an S/D recess 206. In the present embodiments, the S/D recess 206 extends to below a top surface of the fins 204 and into the substrate 202. In the present embodiments, method 300 implements an etching process 402 to remove portions of both the channel layers 204a and the non-channel layers 204b. The etching process 402 may be implemented by a dry etching process, a wet etching process, an RIE process, or combinations thereof. In some embodiments, method 300 implements a dry etching process and/or and RIE process using a suitable etchant or a combination of etchants. In some embodiments, the etching process 402 at operation 302 may be tuned by adjusting duration, temperature, pressure, source power, bias voltage, bias power, etchant flow rate, and/or other suitable parameters. In some embodiments, the non-channel layers 204b are etched more than the channel layers 204a, and the etching process 402 may result in a curved surface on the sidewalls of the non-channel layers 204b as depicted in FIG. 5. A cleaning process may subsequently be performed to clean the S/D recess 206 with a hydrofluoric acid (HF) solution or other suitable solution.

Figure 6:
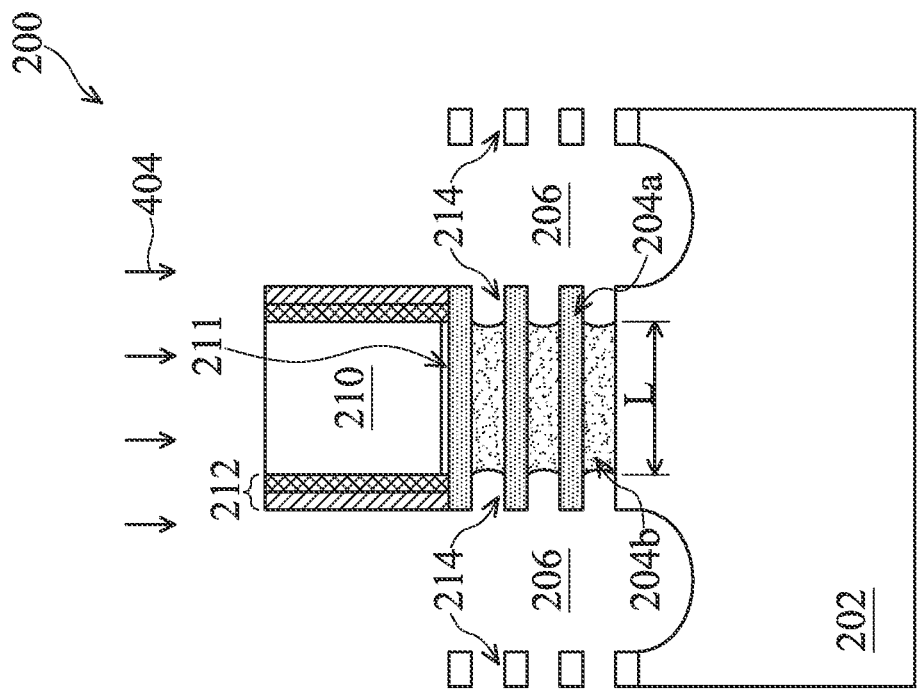

Referring to FIG. 6, method 300 at operation 304 further removes portions of the non-channel layers 204b exposed in the S/D recess 206 to form trenches 214. In the present embodiments, method 300 selectively removes portions of the non-channel layers 204b without removing, or substantially removing, portions of the channel layers 204a exposed in the S/D recess 206. Method 300 forms the trenches 214 by performing an etching process 404 including, for example, a dry etching process, a wet etching process, an RIE process, or combinations thereof. In some embodiments, the etching process 404 a dry etching process and/or an RIE process using a fluorine-based etchant, such as HF, $CF_4$, $SF_6$, $CH_2F_2$, $CHF_3$, $C_2F_6$, other fluorine-containing etchants, or combinations thereof. In some embodiments, method 300 implements a wet etching process using an etchant including nitric acid ($HNO_3$), ammonium hydroxide ($NH_3OH$), ammonium fluoride ($NH_4F$), hydrogen peroxide ($H_2O_2$), other suitable etchants, or combinations thereof. In some embodiments, the etching process 404 at operation 304 is controlled by factors such as duration, temperature, pressure, source power, bias voltage, bias power, etchant flow rate, and/or other suitable parameters to remove a desired amount of the non-channel layer 204b. In the present embodiments, an amount of the non-channel layers 204b removed at operation 304 is controlled by the duration of the etching process 404 to ensure that sufficient channel length L is maintained for forming the metal gate stacks in subsequent processing steps.

Subsequently, referring to FIG. 7, method 300 forms the inner spacers 222 in the trenches 214. In the present embodiments, as will be discussed in detail below, the inner spacers 222 include an air gap 218 embedded, or partially embedded, in a spacer layer 216. At operation 306, referring to FIGS. 9A-9C, method 300 forms the spacer layer 216, in a deposition process 406, in the trenches 214 and on sidewalls 206SW of the S/D recess 206, i.e., over the exposed portions of the channel layers 204a. In the present embodiments, forming the spacer layer 216 creates the air gap 218 embedded or partially embedded therein, a process discussed in detail below.

The spacer layer 216 may include any suitable dielectric material comprising silicon, carbon, oxygen, nitrogen, other elements, or combinations thereof. For example, the spacer layer 216 may include silicon nitride (SiN), silicon oxide (SiO and/or $SiO_2$), silicon carbide (SiC), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), other suitable dielectric material, or combination thereof. In some embodiments, composition of the spacer layer 216 is chosen to possess suitable etching resistance during the subsequent gate replacement process without significantly increasing the parasitic capacitance between the metal gate stacks (e.g., HKMGs 260) and the epitaxial S/D features 230.

The deposition process 406 may include any suitable method, such as ALD, CVD, PVD, other suitable methods, or combinations thereof. In some embodiments, the deposition process 406 includes an ALD process implemented in a high-pulse mode when one or more ALD precursor material is deposited in the trenches 214. The high-pulse mode may be achieved by adjusting one or more parameter of the ALD process, including, though not limited to, increasing pulse time (i.e., duration and/or rate of flow of the precursor material(s)), pulse pressure, pulse energy, and/or pulse frequency when delivering the precursor material(s) for forming the spacer layer 216. In the present embodiments, the ALD process implemented in the high-pulse mode increases the overall deposition rate of the spacer layer 216. In other words, the ALD process provided herein is configured to boost the amount of the precursor material(s) deposited in the trenches 214 per unit time. In some embodiments, the deposition process 406 includes implementing a CVD process at a high deposition rate to achieve similar effects as the ALD process discussed above.

In the present embodiments, referring to FIGS. 9A-9C, increasing the deposition rate of the spacer layer 216, whether during an ALD process or a CVD process, causes the spacer layer 216 to grow at a higher rate laterally across an opening of the trench 214 than vertically into a bulk portion of the trench 214, thereby resulting in the formation of the air gap 218. In the present embodiments, the spacer layer 216 grown in such a manner exhibits an overhung structure characterized by a difference in thickness between the top portion ($t_{top}$) and the bottom portion ($t_{bottom}$) of the spacer layer 216. For example, the extent of the overhung structure may be defined by $(t_{top}-t_{bottom})/t_{bottom}$. In other words, the thickness of the spacer layer 216 measured between the air gap 218 and a sidewall of the trench 214 increases toward the opening of the trench 214.

In addition to and/or as an alternative of adjusting deposition parameters (e.g., pulse pressure, pulse time, etc.) as discussed above, to encourage the formation of the overhung structure (i.e., the formation of the air gap 218), an aspect ratio of the trench 214, defined by a ratio of height H to width W of the trench 214, may be increased to at least about 4. If the aspect ratio is less than about 4, the lateral growth rate of the spacer layer 216 across the opening of the trench 214 may approach the vertical growth rate into the bulk of the trench 214, such that the trench 214 may be completely filled without forming the air gap 218. In the present embodiments, height H also corresponds to an overall thickness of the spacer layer 216, which may be about 5 nm to about 7 nm. In some embodiments, the deposition process 406 at operation 306 is implemented at such a high pulse pressure and/or pulse time that the top portion of the spacer layer 216 merges completely, as depicted in FIG. 9C. In some embodiments, as depicted in FIGS. 9A and 9B, the top portion of the spacer layer 216 includes a small opening, i.e., the spacer layer 216 does not completely seal off the opening of the trench 214. As will be discussed in detail below, the small opening is subsequently sealed by another spacer layer (e.g., spacer layer 220) or by the epitaxial S/D features (e.g., epitaxial S/D features 230).

Still referring to FIGS. 9A-9C, forming the spacer layer 216 may result in the air gap 218 having various configurations, depending upon conditions of the deposition process 406 at operation 306. In the present embodiments, increasing the pulse time of the deposition process (e.g., an ALD process), the pulse pressure of the deposition process, and/or the aspect ratio of the trench 214 encourages the formation of the air gap 218. In some embodiments, comparing the embodiments depicted FIGS. 9B and 9C, increasing both the pulse pressure and the pulse time increases the volume of the air gap 218. In some embodiments, comparing the embodiment depicted in FIG. 9A with those in FIGS. 9B and 9C, increasing the pulse pressure causes a bottom surface of the air gap 218 to curve upward. In some embodiments, increasing the dielectric constant of the material included in the spacer layer 216 decreases the volume of the air gap 218, as materials with higher dielectric constants are generally less flowable than materials with lower dielectric constants and will generally merge less quickly during the deposition process 406. In some examples, the air gap 218 may be defined by a diameter (or a height) of less than about 0.5 nm. While configurations of the air gap 218 are not limited by those depicted in FIGS. 9A-9C, the following disclosure employs the configuration depicted in FIG. 9A as an example for discussion purposes only.

At operation 308, method 300 implements an optional annealing process to the spacer layer 216. The spacer layer 216 may be annealed by any suitable process, such as a furnace annealing process, a rapid thermal annealing (RTA) process, a spike annealing process, a laser annealing process, other suitable annealing process, or combinations thereof, at any temperature suitable for the composition of the spacer layer 216. In some embodiments, one or more elements are introduced to the spacer layer 216 during the annealing process. Elements such as carbon and/or nitrogen may be supplied in the form of one or more gaseous species to the spacer layer 216 for purposes of altering the dielectric constant of the dielectric material(s) included in the spacer layer 216. In one example, carbon may be introduced to the spacer layer 216 if a lower dielectric constant is desired for reducing the parasitic capacitance in the device 200. In another example, nitrogen may be introduced to the spacer layer 216 if a higher dielectric constant is desired to improve the etching resistance of the spacer layer 216. It is understood that operation 308 may be omitted or performed according to specific design requirements.

At operation 310, still referring to FIGS. 7 and 9A-9C, method 300 implements an etching process to remove (or etch back) portions of the spacer layer 216 formed over the channel layers 204a, e.g., the topmost portions of the spacer layer 216 formed over the channel layers 204a as depicted in FIGS. 9A-9C, to form the inner spacers 222. In some embodiments, sidewalls of the spacer layer 216 after etching back are substantially planar with the sidewalls of the channel layers 204a. In some embodiments, as shown in an expanded view of the inner spacer 222 in FIG. 7, the sidewalls of the resulting spacer layer 216 curve inward and away from the sidewalls of the channel layers 204a. The etching process at operation 308 may be any suitable process, such as dry etching, wet etching, RIE, or combinations thereof. The choice of etchant (or a combination of etchants) is not limited in the present embodiments and may depend upon the specific composition of the spacer layer 216. In some embodiments, the etching process is stopped when the sidewalls of the channel layers 204a are exposed. For embodiments in which the spacer layer 216 merges across the opening of the air gap 218, as depicted in FIG. 9C, etching back portions of the spacer layer 216 may create a small opening to the air gap 218. Alternatively, the air gap 218 may remain sealed by the spacer layer 216 after the etching back process.

Subsequently, referring to FIG. 8, method 300 at operations 312 and 314 forms a spacer layer 220 over the spacer layer 216. The spacer layer 220 may include any suitable dielectric material comprising silicon, carbon, oxygen, nitrogen, other elements, or combinations thereof. For example, the spacer layer 220 may include silicon nitride (SiN), silicon oxide (SiO and/or SiO$_2$), silicon carbide (SiC), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), other suitable dielectric material, or combination thereof.

In some embodiments, the spacer layer 220 and the spacer layer 216 have substantially the same composition. In some embodiments, the spacer layer 216 includes a greater amount of carbon than the spacer layer 220. In one such example, the spacer layer 216 may include SiOCN and the spacer layer 220 may include SiON. In another example, the spacer layer 216 may include SiCN and the spacer layer 220 may include SiN. In some embodiments, the spacer layer 220 and the spacer layer 216 differ in terms of their dielectric constant. In one such example, the spacer layer 216 may have a lower dielectric constant than the spacer layer 220. In some embodiments, the spacer layer 220 includes a denser material than the spacer layer 216, i.e., the spacer layer 216 is more porous than the spacer layer 220. It is noted that the present embodiments are not limited to these examples. In the present embodiments, the compositions of the spacer layers 216 and 220 may be selected to enhance device performance in terms of, for example improved etching resistance, reduced parasitic capacitance, and greater design freedom.

Method 300 may form the spacer layer 220 on the spacer layer 216 by a deposition process 408 that implemented by any suitable method, such as ALD, CVD, other suitable methods, or combinations thereof. In the present embodiments, the deposition process 408 needs not be implemented in a high-pulse mode similar to that of the deposition process 406. In some examples, the deposition processes 406 and 408 may be implemented by different processes. For example, the deposition process 406 may be implemented by an ALD process and the deposition process 408 may be implemented by a CVD process. In another example, the deposition processes 406 and 408 may be implemented by the same process, such as a CVD process or an ALD process, with different deposition parameters (e.g., different pulse and/or deposition rate). In the present embodiments, the spacer layer 220 is deposited to a thickness of less than about 1 nm. In some embodiments, a ratio of the thickness of the spacer layer 220 to the thickness of the spacer layer 216 is less than about 1:5.

For embodiments in which the air gap 218 is partially exposed (see FIGS. 9A and 9B), the spacer layer 220 provides a more uniform substrate for subsequently forming the epitaxial S/D features 230. For embodiments in which the spacer layer 216 and the spacer layer 220 have different compositions, using a material with a higher dielectric constant for the spacer layer 220 prevents unintentional growth of the epitaxial S/D material into the air gap 218 and/or interlayer space between the spacer layer 216 and the spacer layer 220. In some embodiments, method 300 omits forming the spacer layer 220, such that the epitaxial S/D features 230 are directly formed on the spacer layer 216 at operation 106 (see FIGS. 1A and 1B), thereby sealing or otherwise covering the air gap 218.

Thereafter, still referring to FIG. 8, method 300 at operation 314 removes portions of the spacer layer 220 formed on the sidewalls of the channel layers 204a, resulting in the inner spacers 223. Accordingly, the inner spacers 223 include a second spacer layer, i.e., the spacer layer 220, in addition to the spacer layer 216 and the air gap 218 disposed therein. In some embodiments, sidewalls of the resulting spacer layer 220 are substantially planar with the sidewalls of the channel layers 204a. In other words, the sidewalls of the spacer layer 220 are continuous with the sidewalls of the channel layers 204a. In some embodiments, as depicted in an expanded view of the inner spacer 232, the sidewalls of the resulting spacer layer 220 curve inward and away from the sidewalls of the channel layers 204a.

The etching process at operation 314 may include a dry etching process, a wet etching process, RIE, or combinations thereof, utilizing an etchant tailed to the selective removal of the spacer layer 220. The choice of etchant (or a combination of etchants) is not limited in the present embodiments and may depend upon the specific composition of the spacer layer 220. In some embodiments, the etching process is stopped when the sidewalls of the channel layers 204a are exposed. For embodiments in which the spacer layer 216 and the spacer layer 220 have substantially the same composition, the etching processes at operations 310 and 314 may result in a more uniform surface to better accommodate subsequent processing steps. In some embodiments, especially when the spacer layer 220 is sufficiently thin, operation 314 may be omitted from method 300. Subsequent operations of method 300 will be discussed in reference to the device 200 having the inner spacers 222, as depicted in FIGS. 10A, 11A, 12A, and 13A, or the inner spacers 223, as depicted in FIGS. 10B, 11B, 12B, and 13B.

Figures 10A, 10B:
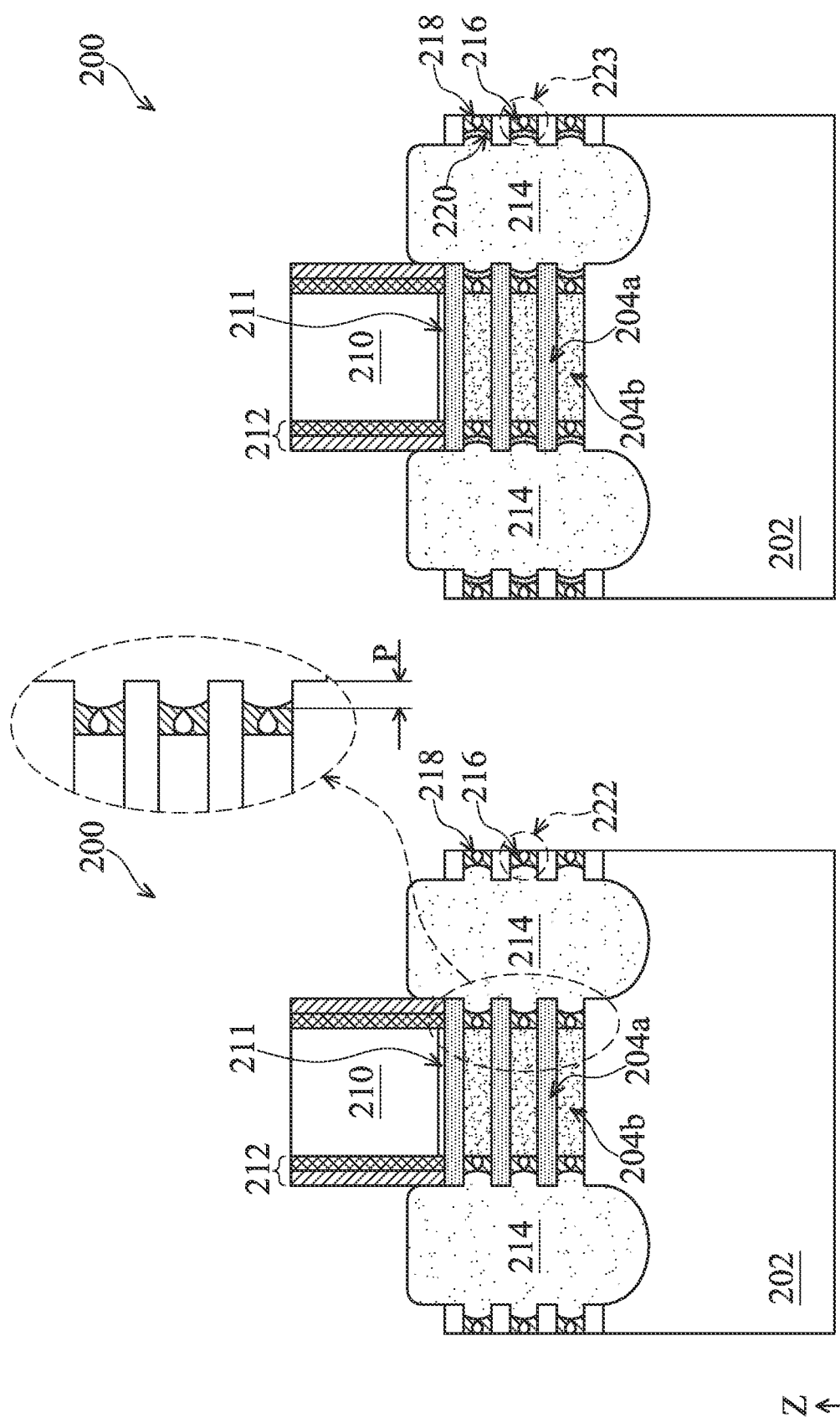

Referring now to FIGS. 10A and 10B, method 300 proceeds from operation 314 to forming the epitaxial S/D features 230 in the S/D recess 206 at operation 106 of method 100. In the depicted embodiment, because the surface of the spacer layer 216 and/or the spacer layer 220 curves inward as discussed and depicted in reference to FIGS. 7 and 8, portions of the epitaxial S/D features 230 extend beyond the sidewalls of the channel layers 204a to contact the spacer layer 216 and/or the spacer layer 220. In other words, portions of the epitaxial S/D features 230 are interleaved between the channel layers 204a. In some examples, a distance P of such protrusion, using the inner spacers 222 as an example, may be about 0.5 nm to about 2 nm. The distance of the protrusion that is in contact with the inner spacers 223 may also be about 0.5 to about 2 nm. In some embodiments, configurations of the inner spacers provided herein offer greater contact area between the epitaxial S/D features 230 and the channel layers 204a, thereby improving the overall performance of the device 200. For embodiments in which the air gap 218 is fully embedded in the spacer layer 216 (see FIG. 9C), the epitaxial S/D features 230 are separated from the air gap 218 by at least a portion of the spacer layer 216.

Each of the epitaxial S/D features 230 may be suitable for forming a p-type FET device (e.g., including a p-type epitaxial material) or alternatively, an n-type FET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, one or more epitaxial growth processes are performed to grow an epitaxial material in the S/D recess 206. For example, method 100 may implement an epitaxial growth process as discussed above with respect to forming the ML. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 230. In some examples, method 100 at operation 106 may first form epitaxial S/D features 230 suitable for an n-type FET and subsequently form epitaxial S/D features 230 suitable for a p-type FET.

Figure 11A:
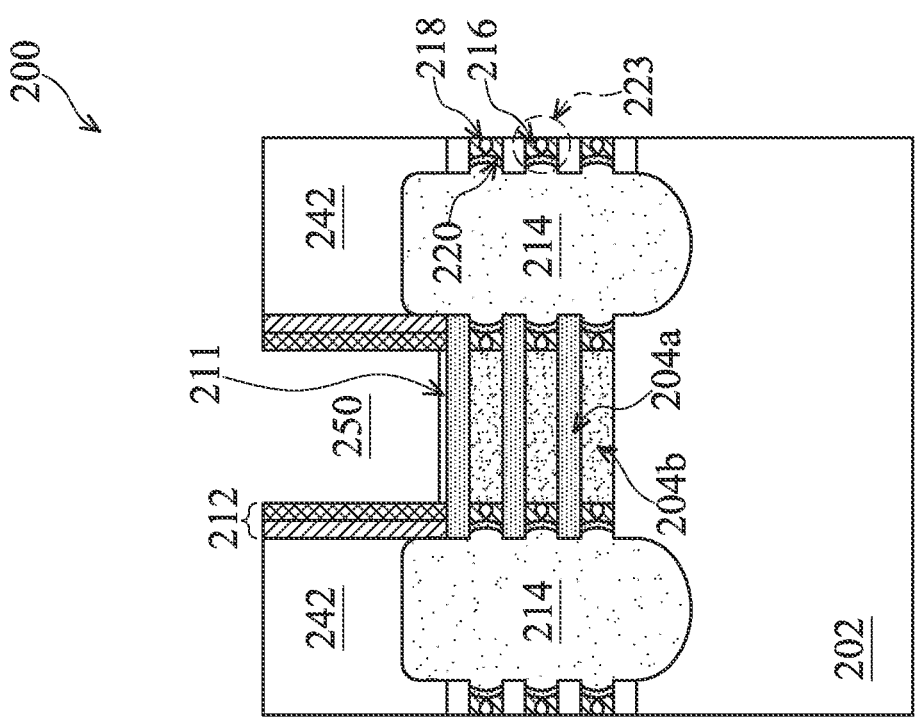
Figure 11B:
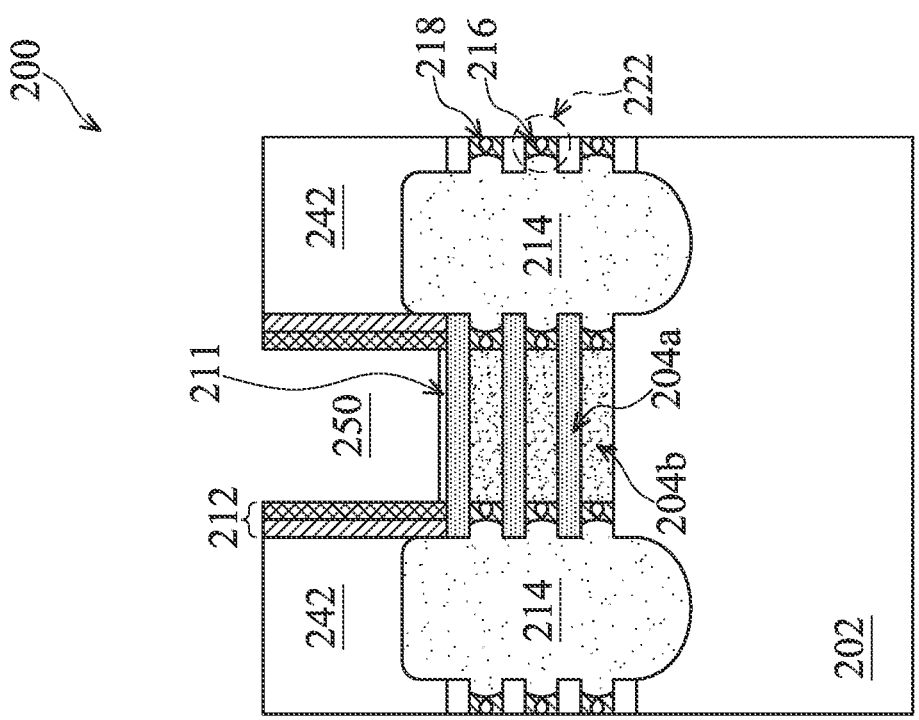

Referring to FIGS. 11A and 11B, method 100 at operation 108 subsequently removes the dummy gate stack 210 to form a gate trench 250 between the top spacers 212. Before removing the dummy gate stack 210, method 100 forms an interlayer dielectric (ILD) layer 242 over the epitaxial S/D features 230 by CVD, flowable CVD (FVCD), spin-on-glass (SOG), other suitable methods, or combinations thereof. The ILD layer 242 may include silicon oxide, a low-k dielectric material, TEOS, doped silicon oxide (e.g., BPSG, FSG, PSG, BSG, etc.), other suitable dielectric materials, or combinations thereof. Method 100 may optionally first form an etch-stop layer (ESL; not depicted) over the epitaxial S/D features 230 before forming the ILD layer 242. The ESL may include silicon nitride (SiN), oxygen- or carbon-doped silicon nitride (SiON or SiCN), other suitable materials, or combinations thereof, and may be formed by CVD, PVD, ALD, other suitable methods, or combinations thereof. Thereafter, method 100 may planarize the ILD layer 242 in one or more CMP processes to expose a top surface of the dummy gate stack 210. Thereafter, at least portions of the dummy gate stack 210 are removed from the device 200 to form the gate trench 250 by any suitable etching process, such as a dry etching process. In the present embodiments, the interfacial layer 211 remains over the ML after removing the dummy gate stack 210.

Figure 12A:
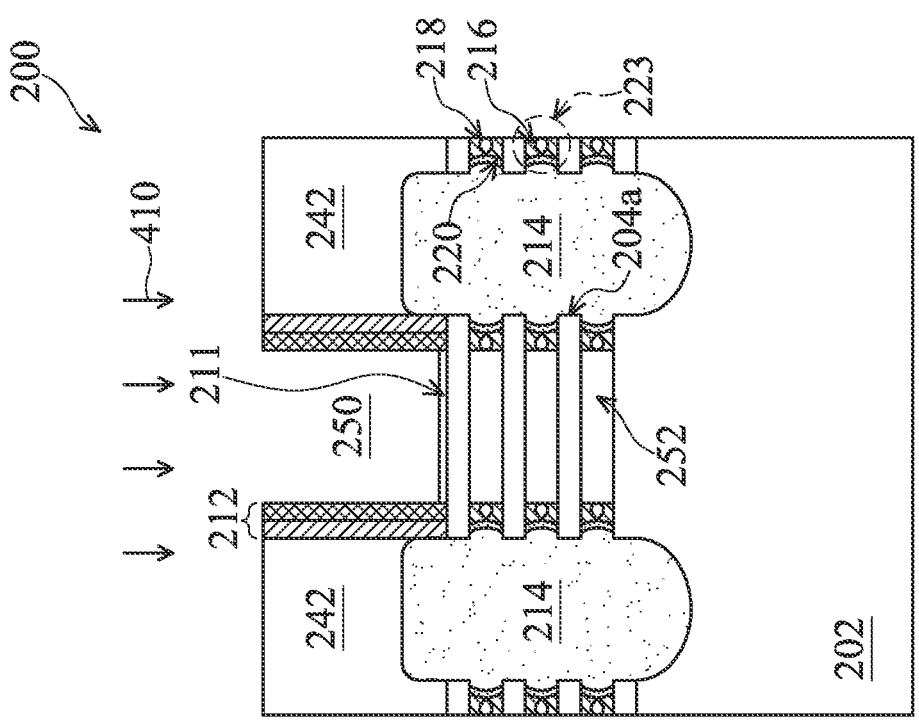
Figure 12B:
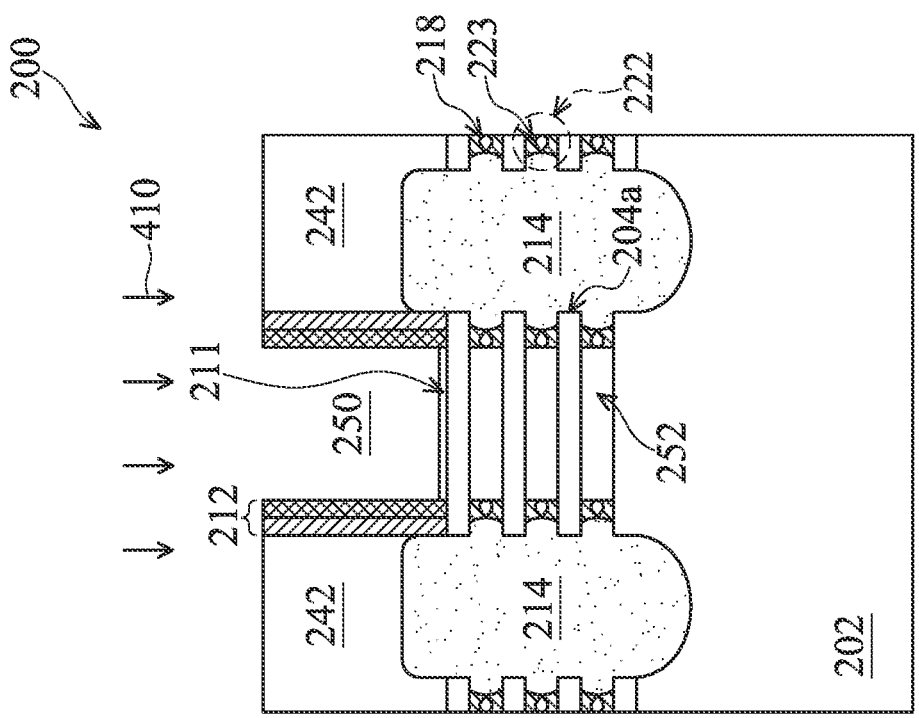

Referring to FIGS. 12A and 12B, method 100 at operation 110 then removes the non-channel layers 204b from the ML in the sheet (or wire) formation process, thereby forming openings 252 between the channel layers 204a. In the present embodiments, method 100 selectively removes the non-channel layers 204b without removing, or substantially removing, the channel layers 204a. This may be accomplished by ensuring that sufficient etching selectivity exists between the non-channel layers 204b, the channel layers 204a, and the spacer layer 216 (as a portion of the inner spacers 222 or 223). The non-channel layers 204b may be selectively removed by an etching process 410 implemented by, for example, a dry etching process, a wet etching process, an RIE process, or combinations thereof. In some embodiments, the etching process 410 includes a dry etching process and/or an RIE process using a fluorine-based etchant, such as HF, $CF_4$, $SF_6$, $CH_2F_2$, $CHF_3$, $C_2F_6$, other fluorine-containing etchants, or combinations thereof. In some embodiments, the etching process 410 includes a wet etching process using an etchant including nitric acid ($HNO_3$), ammonium hydroxide ($NH_3OH$), ammonium fluoride ($NH_4F$), hydrogen peroxide ($H_2O_2$), other suitable etchants, or combinations thereof. In some embodiments, the etching process 410 implements the same etchant(s) as the etching process 404.

Figure 13B:
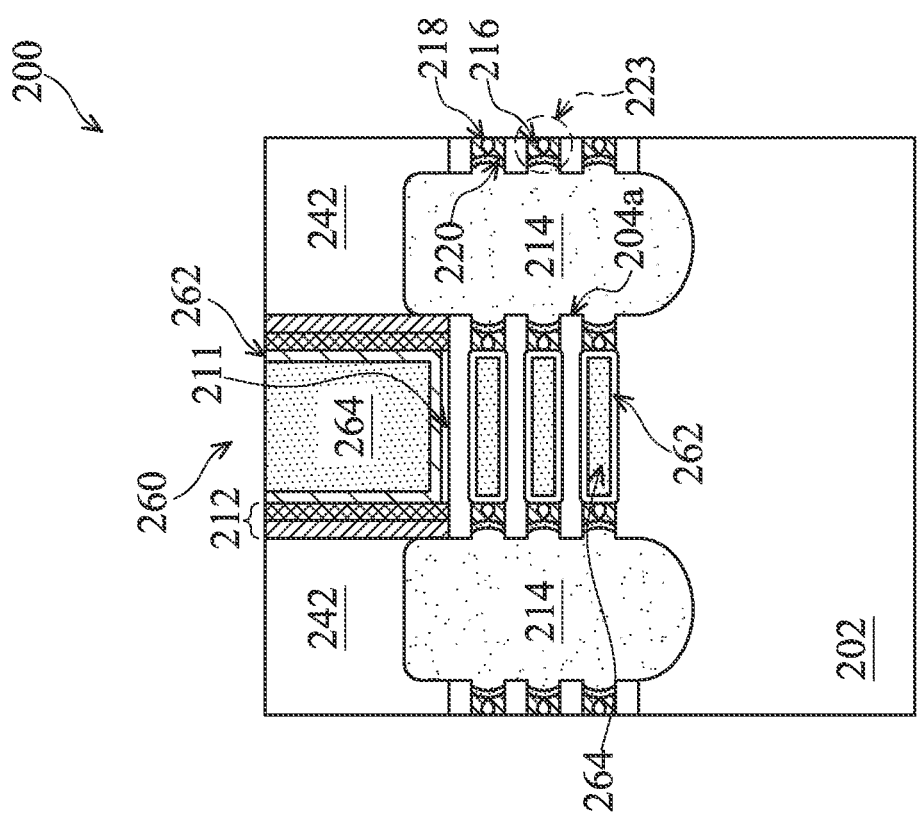
Figure 13A:
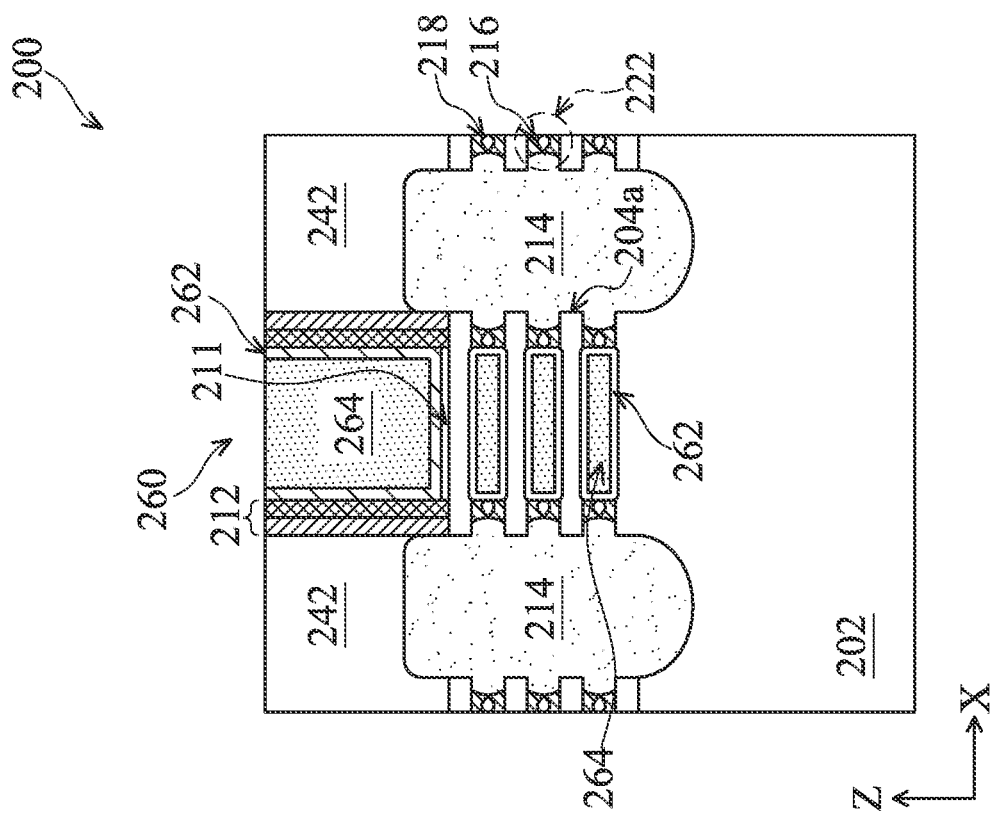

Now referring to FIGS. 13A and 13B, method 100 at operation 112 forms the HKMG 260 in the gate trench 250 and the openings 252. In other words, the HKMG 260 is formed between the top spacers 212 as well as between the inner spacers 222 or 223. The HKMG 260 includes at least a high-k dielectric layer 262 disposed in the gate trench 250 and in the openings 252 and a metal gate electrode 264 disposed over the high-k dielectric layer 262. In the present embodiments, for the top portion of the HKMG 260 formed in the gate trench 250, sidewall portions of the high-k dielectric layer 262 are formed on the top spacers 212, while a bottom portion of the high-k dielectric layer 262 is formed over the topmost channel layer 204a (and/or the interfacial layer 211, if present), such that the high-k dielectric layer 262 is configured to be U-shaped. For portions of the HKMG 260 formed in the openings 252, sidewall portions of the high-k dielectric layer 262 are formed on the inner spacers 222 or 223 (e.g., the spacer layer 216), while top and bottom portions of the high-k dielectric layer 262 are formed on the channel layers 204a, such that the high-k dielectric layer 262 is enclosed by the channel layers 204a and the inner spacers 222 or 223.

The high-k dielectric layer 262 may include any suitable high-k dielectric material, such as hafnium oxide, lanthanum oxide, other suitable materials, or combinations thereof. In some embodiments, the high-k dielectric layer 262 includes a dielectric material having a higher dielectric constant than that included in the spacer layer 216 and/or the spacer layer 220. The metal gate electrode 264 may include at least one work function metal layer (not depicted separately) and a bulk conductive layer (not depicted separately) and disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The HKMG 260 may further include numerous other layers (not depicted), such as a capping layer, a barrier layer, other suitable layers, or combinations thereof. In some embodiments, the number of material layers included in each HKMG 260 is determined by the size of the opening 252 disposed between the channel layers 204a. Various layers of the HKMG 260 may be deposited by any suitable method, such as chemical oxidation, thermal oxidation, ALD, CVD, PVD, plating, other suitable methods, or combinations thereof.

Thereafter, method 100 at operation 114 may perform additional processing steps to the device 200. For example, method 100 may form S/D contacts (not depicted) over the epitaxial S/D features 230. Each S/D contact may include any suitable conductive material, such as Co, W, Ru, Cu, Al, Ti, Ni, Au, Pt, Pd, other suitable conductive materials, or combinations thereof. Method 100 may form an S/D contact opening (or trench) in the ILD layer 242 and over the epitaxial S/D features 230 via a series of patterning and etching processes and subsequently deposit a conductive material in the S/D contact opening using any suitable method, such as CVD, PVD, plating, other suitable processes, or combinations thereof. In some embodiments, a barrier layer including Ti, Ta, TiN, TaN, other suitable materials, or combinations thereof may be formed in the contact opening before depositing the conductive material.

In some embodiments, a silicide layer (not depicted) is formed between the epitaxial S/D features 230 and the S/D contact. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. For example, a metal layer (e.g., titanium) may be deposited over the epitaxial S/D features 230, and the device 200 is annealed to allow the metal layer and the semiconductor materials of the epitaxial S/D features 230 to react. Thereafter, the un-reacted metal layer is removed, leaving the silicide layer over the epitaxial S/D features 230.

Subsequently, method 100 may form additional features over the device 200 including, for example, gate contacts over the HKMG 260, vertical interconnect features (e.g., vias), horizontal interconnect features (e.g., conductive lines), dielectric layers (e.g., intermetal dielectric layers), other suitable features, or combinations thereof over the S/D contacts.

Although not intended to be limiting, one or more embodiments of the present disclosure provide many benefits to a semiconductor device and the formation thereof. For example, the present disclosure provides inner spacers (e.g., the inner spacers 222 and 223) in GAA FETs having an air gap enclosed by one or more dielectric layers. In some embodiments, the air gap is at least partially embedded in a first dielectric layer (e.g., the spacer layer 216). Some embodiments of the inner spacers include a second dielectric layer (e.g., the spacer layer 220) disposed over the first dielectric layer with the air gap enclosed by both the first and the second dielectric layers. The first and the second dielectric layers may have substantially the same composition. Alternatively, the second dielectric layer may include a material having a higher dielectric constant than the first dielectric layer. In some embodiments, portions of S/D features extend to contact the inner spacers between two channel layers. With the inclusion of the air gap, the present embodiments provide inner spacers configured to lower the parasitic capacitance of GAA FETs. Furthermore, the present embodiments also provide inner spacers including dissimilar dielectric materials, allowing greater flexibility to meet various design requirements. Embodiments of the disclosed methods can be readily integrated into existing processes and technologies for manufacturing three-dimensional FETs, such as GAA FETs.

In one aspect, the present embodiments provide a method that includes forming a dummy gate stack over a fin protruding from a semiconductor substrate, where the fin includes a multi-layer stack (ML) of alternating channel layers and non-channel layers, forming an S/D recess in the ML, forming an inner spacer layer in the S/D recess, forming an epitaxial source/drain (S/D) feature in the S/D recess and over the inner spacer layer, removing the non-channel layers from the ML to form openings interposed between the inner spacer layer, and forming a metal gate stack in the openings and in place of the dummy gate stack. In the present embodiments, forming the inner spacer layer includes recessing a portion of each non-channel layer to form a trench and depositing an inner spacer layer in the trench, thereby forming an air gap in the inner spacer layer.

In another aspect, the present embodiments provide a semiconductor structure that includes a stack of semiconductor layers disposed over a substrate, a metal gate stack having a top portion disposed over the stack of semiconductor layers and a bottom portion interleaved with the stack of semiconductor layers, an inner spacer disposed on sidewalls of the bottom portion of the metal gate stack, an air gap enclosed in the inner spacer, and an epitaxial source/drain (S/D) feature disposed over the inner spacer and adjacent to the metal gate stack.

In yet another aspect, the present embodiments provide a semiconductor substrate that includes semiconductor layers disposed over a substrate, a high-k metal gate stack (HKMG) disposed between the semiconductor layers, a source/drain (S/D) feature disposed adjacent to the HKMG, and an inner spacer configured to separate the S/D feature from the HKMG, where the inner spacer includes a first dielectric layer disposed on a sidewall of the HKMG, an air gap disposed in the first dielectric layer, and a second dielectric layer disposed over the first dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dummy gate stack over a fin protruding from a semiconductor substrate, wherein the fin includes a multi-layer stack (ML) of alternating channel layers and non-channel layers;
    forming an S/D recess in the ML;
    recessing a portion of each non-channel layer to form a trench;
    depositing an inner spacer layer in the trench, wherein the depositing forms an air gap in the inner spacer layer, and wherein a thickness of a portion of the inner spacer layer formed between the air gap and a sidewall of the trench increases toward an opening of the trench;
    forming an epitaxial source/drain (S/D) feature in the S/D recess and over the inner spacer layer;
    removing the non-channel layers from the ML to form openings interposed between the inner spacer layer; and
    forming a metal gate stack in the openings and in place of the dummy gate stack.

2. The method of claim 1, further comprising, before forming the epitaxial S/D feature, removing portions of the inner spacer layer formed on sidewalls of the channel layers.

3. The method of claim 1, wherein depositing the inner spacer layer includes implementing an atomic layer deposition (ALD) process in a high-pulse mode.

4. The method of claim 2, further comprising annealing the inner spacer layer before removing the portions of the inner spacer layer from the sidewalls of the channel layers.

5. The method of claim 3, wherein increasing pulse pressure and pulse time of the ALD process increases a volume of the air gap.

6. The method of claim 1, wherein depositing the inner spacer layer results in the air gap to be partially enclosed by the inner spacer layer, such that forming the epitaxial S/D feature seals the air gap.

7. The method of claim 1, wherein depositing the inner spacer layer results in the air gap to be fully embedded in the inner spacer layer, such that a portion of the inner spacer layer is disposed between the air gap and the epitaxial S/D feature.

8. The method of claim 1, wherein the inner spacer layer is a first inner spacer layer, the method further comprising forming a second inner spacer layer over the first inner spacer layer before forming the epitaxial S/D feature.

9. A semiconductor structure, comprising:
    a stack of semiconductor layers disposed over a substrate;
    a metal gate stack having a top portion disposed over the stack of semiconductor layers and a bottom portion interleaved with the stack of semiconductor layers;
    an inner spacer disposed on sidewalls of the bottom portion of the metal gate stack and between two semiconductor layers;
    an air gap enclosed in the inner spacer; and
    an epitaxial source/drain (S/D) feature disposed over the inner spacer and adjacent to the metal gate stack, wherein opposing sidewalls of the air gap defined by the inner spacer are slanted toward each other near an interface between the inner spacer and the epitaxial S/D feature.

10. The semiconductor structure of claim 9, wherein the inner spacer is a first inner spacer, the semiconductor structure further comprising a second inner spacer disposed between the first inner spacer and the epitaxial S/D feature.

11. The semiconductor structure of claim 10, wherein the second inner spacer gap is disposed along the interface.

12. The semiconductor structure of claim 10, wherein the second inner spacer exhibits a higher dielectric constant than the first inner spacer.

13. The semiconductor structure of claim 9, wherein a portion of the epitaxial S/D feature laterally extends between two semiconductor layers to directly contact the inner spacer.

14. The semiconductor structure of claim 9, wherein the opposing sidewalls of the air gap defined by the inner spacer are merged together, such that the epitaxial S/D feature is separated from the air gap by a portion of the inner spacer.

15. The semiconductor structure of claim 9, wherein a thickness of a portion of the inner spacer disposed between the air gap and an adjacent semiconductor layer increases in a direction toward the epitaxial S/D feature.

16. The semiconductor structure of claim 9, wherein a portion of the inner spacer disposed between the air gap and the bottom portion of the metal gate stack curves toward the epitaxial S/D feature.

17. A semiconductor structure, comprising:
    semiconductor layers disposed over a substrate;
    a high-k metal gate stack (HKMG) disposed between the semiconductor layers;
    a source/drain (S/D) feature disposed adjacent to the HKMG; and
    an inner spacer configured to separate the S/D feature from the HKMG, wherein the inner spacer includes a first dielectric layer disposed on a sidewall of the HKMG, an air gap disposed in the first dielectric layer, and a second dielectric layer disposed over the first dielectric layer, and wherein a separation distance between a boundary of the air gap and an adjacent semiconductor layer increases in a direction toward the S/D feature.

18. The semiconductor structure of claim 17, wherein the air gap is embedded in the first dielectric layer, such that the second dielectric layer is separated from the air gap by a portion of the first dielectric layer.

19. The semiconductor structure of claim 17, wherein a portion of the S/D feature is disposed between two semiconductor layers to contact the second dielectric layer.

20. The semiconductor structure of claim 17, wherein the first dielectric layer has a first dielectric constant and the second dielectric layer has a second dielectric constant, and wherein the second dielectric constant is greater than the first dielectric constant.

* * * * *